United States Patent
Liebau et al.

(10) Patent No.: US 7,935,634 B2
(45) Date of Patent: May 3, 2011

(54) INTEGRATED CIRCUITS, MICROMECHANICAL DEVICES, AND METHOD OF MAKING SAME

(75) Inventors: Maik Liebau, Dresden (DE); Thomas Betzl, Dresden (DE); Olaf Storbeck, Dresden (DE); Georg Duesberg, Booterstown (IE); Guenther Aichmayr, Dresden (DE)

(73) Assignee: Qimonda AG, Munich (DE)

( * ) Notice: Subject to any disclaimer, the term of this patent is extended or adjusted under 35 U.S.C. 154(b) by 922 days.

(21) Appl. No.: 11/839,890

(22) Filed: Aug. 16, 2007

(65) Prior Publication Data
US 2009/0045161 A1 Feb. 19, 2009

(51) Int. Cl.
*H01L 21/302* (2006.01)
*H01L 21/461* (2006.01)

(52) U.S. Cl. ............ 438/689; 438/687; 216/13; 216/67; 257/E21.111; 257/E21.576; 257/E21.579; 257/317; 257/321

(58) Field of Classification Search .................... 216/13, 216/67; 438/687, 689; 257/317, 321, E21.111, 257/E21.576, E21.579
See application file for complete search history.

(56) References Cited

U.S. PATENT DOCUMENTS

| | | | |
|---|---|---|---|
| 4,361,461 A | 11/1982 | Chang | |
| 6,566,260 B2 * | 5/2003 | Chooi et al. | 438/687 |
| 2007/0010094 A1 | 1/2007 | Kreupl et al. | |

FOREIGN PATENT DOCUMENTS

| | | |
|---|---|---|
| DE | 10359889 | 7/2005 |
| DE | 102004006544 | 9/2005 |
| DE | 102004031128 | 1/2006 |
| DE | 102004049452 | 4/2006 |
| DE | 102004049452 A1 * | 4/2006 |
| WO | 2005033358 | 4/2005 |
| WO | 2005081296 | 9/2005 |

OTHER PUBLICATIONS

Wolf and R.N. Tauber, (Silicon Processing for the VLSI Era, vol. 1—Process Technology, Lattice Press, 1986) (pp. 546-547).*

* cited by examiner

*Primary Examiner* — Nadine G Norton
*Assistant Examiner* — Mahmoud Dahimene
(74) *Attorney, Agent, or Firm* — Patterson & Sheridan, LLP (57) ABSTRACT

A method of making an integrated circuit comprises providing a substrate and forming a structure on the substrate comprising a first enclosed portion of a carbon material and a second portion of the carbon material, wherein an intersection of the first and second portion of the carbon material has a defined dimension. The method further comprises processing the substrate with a plasma comprising hydrogen in order to etch the second portion of the carbon material, wherein the defined dimension of the intersection of the first and second portion of the carbon material substantially suppresses etching of the first enclosed portion of the carbon material in a self-limiting way.

22 Claims, 11 Drawing Sheets

INTEGRATED CIRCUITS, MICROMECHANICAL DEVICES, AND METHOD OF MAKING SAME

BACKGROUND OF THE INVENTION

1. Field of the Invention

The invention generally relates to substrate processing and manufacture of integrated circuits and micromechanical devices.

2. Description of the Related Art

The manufacture of electronic elements and devices involves the use of a variety of materials and different processing techniques. One material used in the manufacture of electronic elements and devices is carbon material. Accordingly, a challenge of fabrication processes is the effective processing of carbon material.

SUMMARY OF THE INVENTION

Embodiments of the invention generally provide methods of substrate processing and manufacture of integrated circuits and micromechanical devices.

One embodiment provides a method of making an integrated circuit. The method generally includes providing a substrate, forming a structure on the substrate comprising a first enclosed portion of a carbon material and a second portion of the carbon material, wherein an intersection of the first and second portion of the carbon material has a defined dimension, and processing the substrate with a plasma comprising hydrogen in order to etch the second portion of the carbon material, wherein the defined dimension of the intersection of the first and second portion of the carbon material substantially suppresses etching of the first enclosed portion of the carbon material in a self-limiting way.

BRIEF DESCRIPTION OF THE DRAWINGS

Various features of embodiments will become clear from the following description, taking in conjunction with the accompanying drawings. It is to be noted, however, that the accompanying drawings illustrate only typical embodiments and are, therefore, not to be considered limiting of the scope of the invention. The present invention may admit other equally effective embodiments.

DETAILED DESCRIPTION OF THE PREFERRED EMBODIMENT

Embodiments described below relate to a method of structuring a carbon material, in particular to a method of making an integrated circuit and a method of making a micromechanical device.

In various integrated devices, use is made of a carbon material in order to form electric and electronic components. As an example, these circuit components may include terminals, e.g. source/drain and gate of a transistor, electrodes of capacitors, coils of inductors as well as further conductive structures like e.g. conductor paths and vertical paths, also referred to as vias. In addition, structures of micromechanical devices may be fabricated from a carbon material. Moreover, a carbon material may be used to form so called hard masks, which are e.g. applied in etch processes or ion implantation doping processes for masking purposes. In order to structure a carbon material in view of the different possible applications, oxygen and hydrogen based processes may be performed, e.g. plasma etch processes. A challenge of these processes is the simple and well directed structuring of the carbon material.

According to an embodiment, there is a method of structuring a carbon material, which comprises providing a substrate and forming a structure on the substrate comprising a first enclosed portion of a carbon material and a second portion of the carbon material, wherein an intersection of the first and second portion of the carbon material has a defined dimension. The method further comprises processing the substrate with a plasma comprising hydrogen in order to etch the second portion of the carbon material, wherein the defined dimension of the intersection of the first and second portion of the carbon material substantially suppresses etching of the first enclosed portion of the carbon material in a self-limiting way.

According to a further embodiment, there is a method of structuring a carbon layer, which comprises providing a substrate, forming a carbon layer on the substrate having a defined thickness and forming a masking layer on the carbon layer, the masking layer covering a portion of the carbon layer. The method further comprises processing the substrate with a plasma comprising hydrogen in order to etch an uncovered portion of the carbon layer, wherein the defined thickness of the carbon layer substantially suppresses etching of the covered portion of the carbon layer in a self-limiting way.

According to yet another embodiment, there is a method of structuring a carbon material, which comprises providing a substrate having a recess with a defined width, depositing a carbon material on the substrate, wherein the recess is completely filled with the carbon material, and processing the substrate with a plasma comprising hydrogen in order to etch a portion of the carbon material outside the recess, wherein the defined width of the recess substantially suppresses etching of the carbon material inside the recess in a self-limiting way.

Further embodiments of a method of structuring a carbon material are explained in conjunction with the drawings.

Figure 1A:
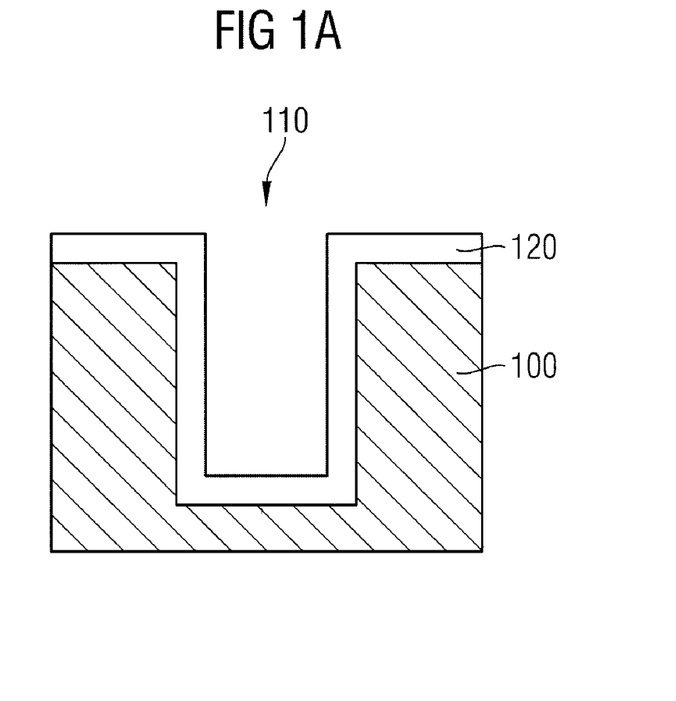
FIGS. 1A to 1C show schematic cross sections of a substrate illustrating steps of a method of fabricating a carbon layer in a trench.
Figure 1B:
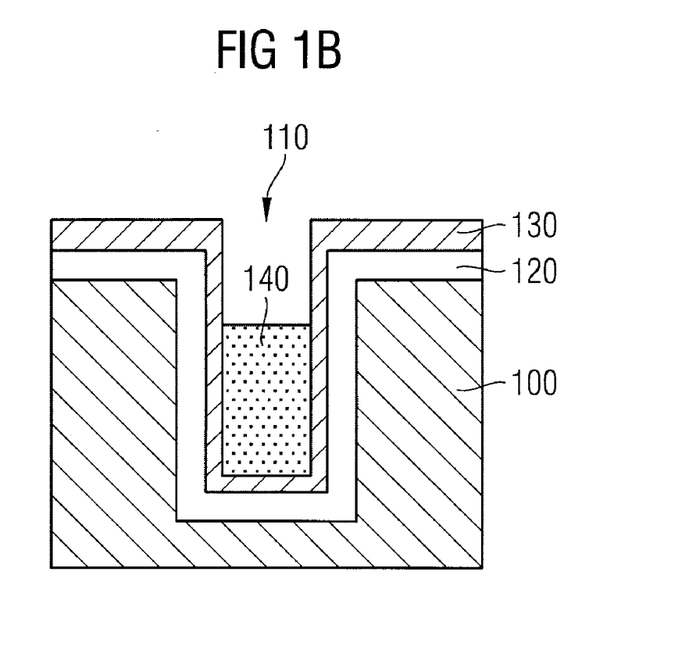
Figure 1C:
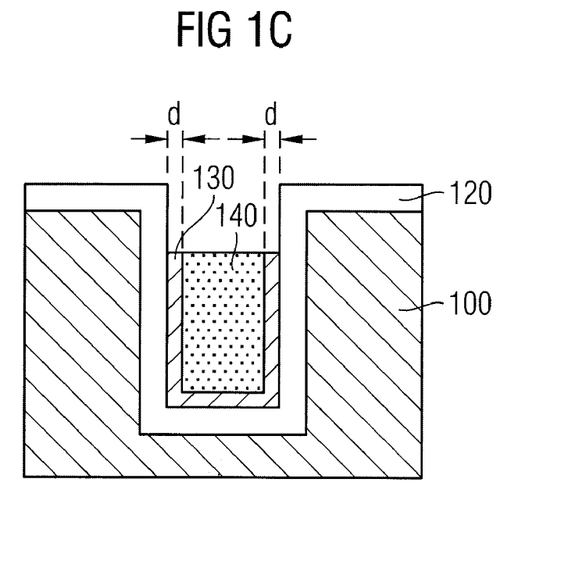

FIGS. 1A to 1C show schematic cross sections of a substrate 100 illustrating steps of a method of fabricating a defined carbon layer 130 in a trench 110 disposed on the substrate 100. The substrate 100 may e.g. be a semiconductor substrate. Further, the fabricated carbon layer 130 may serve as an electrode of a trench capacitor, e.g. of a Dynamic Random Access Memory (DRAM) cell.

As illustrated in FIG. 1A, a trench structure 110 may be fabricated on the substrate 100. Accordingly, a trench extending downwardly can be produced in a surface of the substrate 100. In addition, a dielectric layer 120 may be formed on the substrate surface in the area of the trench. The dielectric layer 120 can be relatively inert against a plasma comprising hydrogen and comprises e.g. silicon oxide. Alternatively, the dielectric layer 120 may comprise other relatively inert materials.

Subsequently, a carbon material can be deposited on the dielectric layer 120 of the substrate 100. In this way a stepped carbon layer 130 may be formed, which covers a bottom and sidewalls of the trench 110 and a surface area adjoining the sidewalls of the trench 110 (FIG. 1B). Inside the trench 110, the carbon layer 130 has a defined thickness d, which is indicated in FIG. 1C. The thickness d may be below 50 nm. According to an exemplary embodiment, the thickness d can be 25 nm. Moreover, the thickness d may have other values, e.g. 15 nm or 10 nm.

Forming the carbon layer 130 may be carried out by pyrolytically depositing the carbon material on the dielectric layer 120 from a process gas comprising carbon. The process gas may for example be ethene, ethylene, or methane. Moreover, further process gases or gas mixtures comprising carbon may be applied like e.g. aromatic compounds or alcohols.

The carbon deposition process may be performed in a process chamber under a variety of different process conditions. As an example, the carbon deposition may be carried out at a pressure between 10 and 1013 hPa (normal pressure) and a temperature between 400 and 1200° C. A process gas used to deposit the carbon material may be applied to the process chamber with a gas flow rate between 1 sccm and 10 slm.

According to an exemplary embodiment, the carbon deposition process is carried out at a pressure between 300 and 700 hPa and a temperature between 600 and 950° C., wherein a process gas used to deposit the carbon material is fed to the process chamber with a gas flow rate between 1 and 5 slm. Carrying out a carbon deposition with the preceding specifications of process parameters makes it possible to form a carbon layer 130 with an advantageous quality, e.g. with respect to adhesion and conductivity demands. Apart from the given specifications, the carbon deposition may be carried out according to different process conditions.

In addition, further process steps may be applied in order to increase the conductivity of the carbon layer 130. As an example, an in situ doping process may be carried out during the carbon deposition. Alternatively, subsequent to the carbon deposition, an ion implantation doping process may be carried out. These doping processes may be performed by applying doping materials like e.g. boron, phosphor, arsenic or mixtures of these materials. Furthermore other doping materials may be used. Moreover, an intercalation process may be performed in order to improve the conductivity of the carbon layer 130. Possible intercalation materials are metal halogenides like e.g. arsenic fluoride, antimony fluoride or mixtures thereof. Apart from these materials, other intercalation materials may be applied. These different doping and intercalation processes may be completed by an additional thermal activation.

Subsequent to the carbon deposition, a masking layer 140 is formed on the carbon layer 130 inside the trench 110, which fills the trench 110 to a predetermined level (FIG. 1B).

The masking layer 140 comprises, like the dielectric layer 120, a material which is relatively inert against a plasma comprising hydrogen. As an example, the masking layer 140 may comprise poly silicon or silicon oxide. In addition, the masking layer 140 may comprise other relatively inert materials.

Forming the masking layer 140 inside the trench 110 may be carried out by depositing the masking layer 140 on the carbon layer 130 in a large-area fashion, thereby completely filling the trench 110, and subsequently recessing the masking layer 140 by applying an etch process in order to only fill the recess 110 to the predetermined level. Recess etching the masking layer 140 may be performed by means of an appropriate wet etch or dry etch process without a removal of the carbon layer 130. Consequently, a portion of the carbon layer 130 inside the trench 110 is covered by the masking layer 140, thereby being enclosed by the dielectric layer 120 and the masking layer 140.

Subsequent to the fabrication of the masking layer 140, the substrate 100 is processed with a plasma comprising hydrogen in order to structure the carbon layer 130. In this way, only a portion of the carbon layer 130 not being enclosed by the dielectric layer 120 and the masking layer 140 is etched away. The enclosed portion of the carbon layer 130, however, remains inside the trench 110, as illustrated in FIG. 1C. At this, a spacing between the dielectric layer 120 and the masking layer 140 at the intersection of the enclosed and non-enclosed portion of the carbon layer 130, which spacing corresponds to the thickness d of the carbon layer 130, substantially suppresses etching of the enclosed portion of the carbon layer 130 in a self-limiting or self-adjusting way. That means that the plasma etch process stops at the enclosed portion of the carbon layer 130 although the substrate 100 is further on subjected to the hydrogen plasma. A reason for this etch characteristic is that both the dielectric layer 120 and the masking layer 140 are relatively inert against the hydrogen plasma, and that the plasma is not or only negligibly active with respect to such enclosing structures having a defined cross-sectional dimension below 50 nm.

The plasma may be formed from a gas mixture comprising hydrogen and an inert gas. As an example, the plasma may be formed from a forming gas which is a gas mixture of hydrogen and nitrogen. A fraction of hydrogen in the forming gas may be between 1 and 5.5%, for example 4%. Besides these specifications, other fractions of hydrogen in the forming gas may be concealed. Moreover, other gas mixtures comprising hydrogen or a pure hydrogen gas may be applied to form the plasma.

Processing the substrate 100 with the plasma may be performed in a process chamber under a variety of different process conditions. As an example, processing the substrate 100 may be carried out at a pressure between 200 and 1200 mTorr. A process temperature may be between 100 and 350° C. The plasma power may be set between 500 and 3000 W. A process gas used to form the plasma may be applied to the process chamber with a gas flow rate between 100 and 10000 sccm.

According to an exemplary embodiment, processing the substrate 100 with the plasma is carried out at a pressure of 650 mTorr, a temperature of 250° C. and with a plasma power of 2500 W, wherein a process gas used to form the plasma is applied to the process chamber with a gas flow rate of 4000 sccm. Apart from the given specifications, the hydrogen plasma etch process may be carried out according to different process conditions.

The described method makes it possible to recess etch the carbon layer 130 to a predefined level, which equals the predetermined level of the masking layer 140 (FIG. 1C). In particular, the method may prevent or substantially suppress an overetch of the carbon layer 130, i.e. a partial removal of the enclosed portion of the carbon layer 130. Consequently, the formation of voids or divots extending between the dielectric layer 120 and the masking layer 140 is avoided. In this way, provided that the patterned carbon layer 130 serves as an electrode of a trench capacitor, a high quality and reliability of the electrode and of the trench capacitor may be achieved. In order to proceed the fabrication of a trench capacitor, further process steps may be performed, e.g. an additional deposition process carried out to completely fill an upper region of the trench 110 with a poly silicon material, thereby establishing a contacting connection to the carbon layer 130.

Figure 2A:
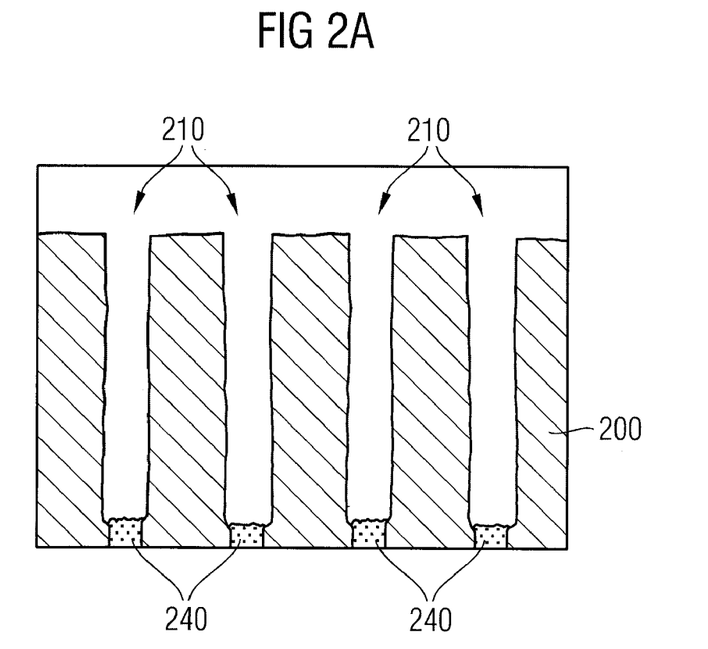
FIGS. 2A to 2E show cross sections of a substrate having trenches subsequent to different process steps.
Figure 2B:
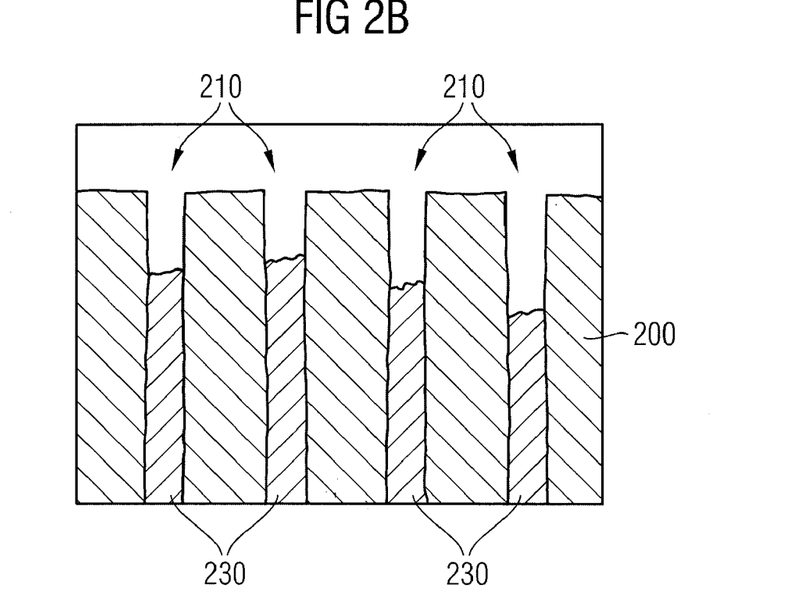
Figure 2C:
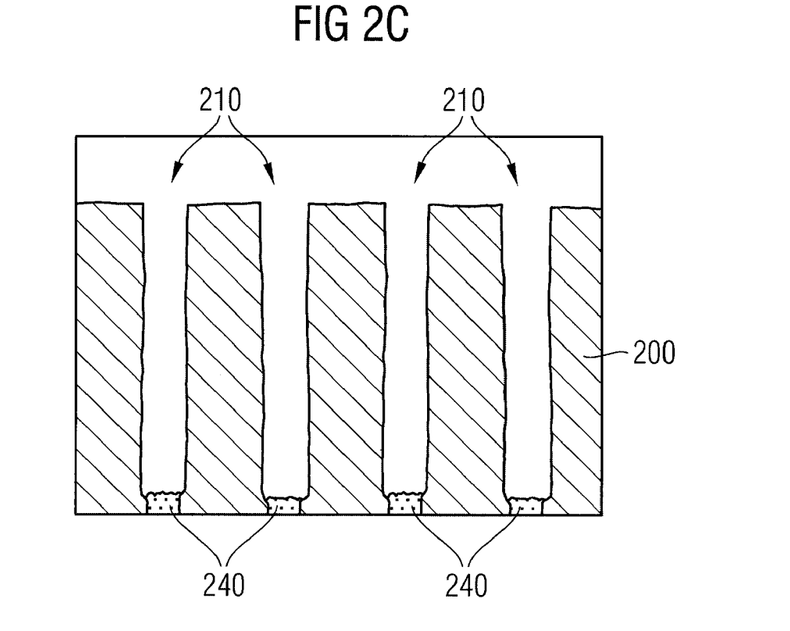
Figure 2D:
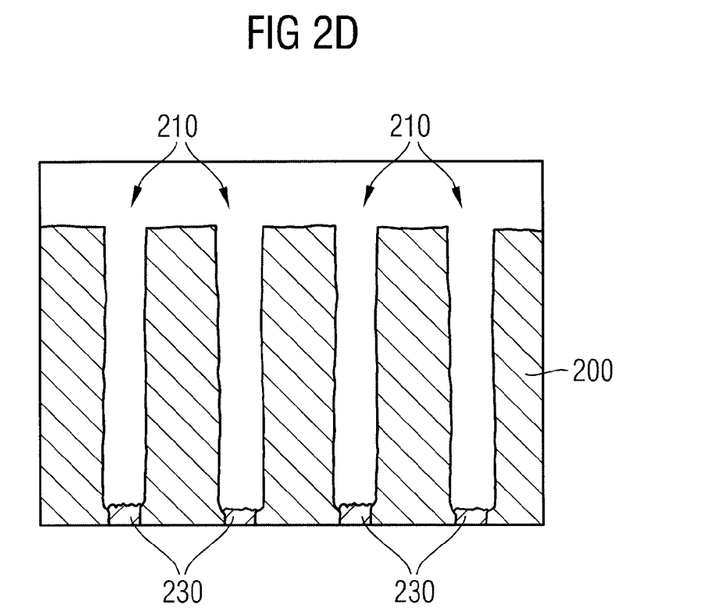
Figure 2E:
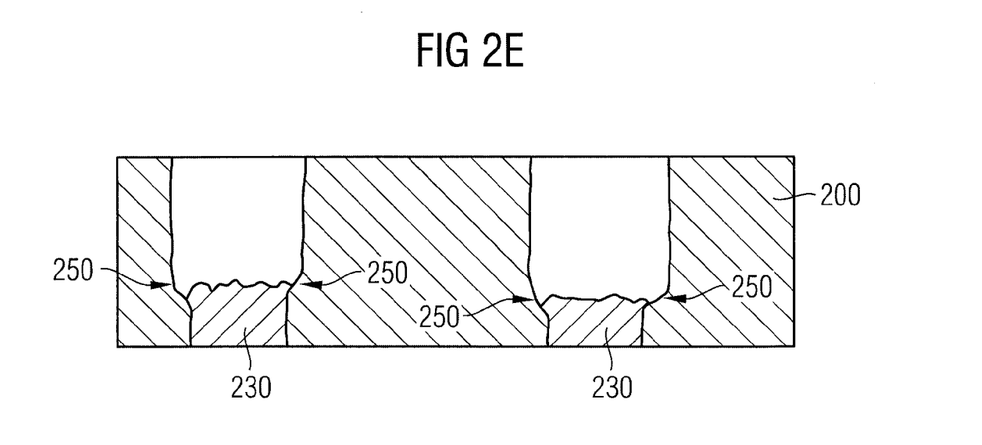

In order to illustrate the self-limiting character of the afore described method illustrated with reference to FIGS. 1A to 1C, FIGS. 2A to 2E show cross sections of a semiconductor substrate 200 having trenches 210 subsequent to different process steps. The depicted cross sections are based on images taken by a scanning electron microscope (SEM). At this, FIGS. 2A and 2C relate to a center section of the trenches 210, and FIGS. 2B and 2D relate to an edge section of the trenches 210. FIG. 2E is an enlarged illustration of the trenches 210 of FIG. 2D.

With reference to FIGS. 2A and 2B, corresponding to the method steps depicted in the preceding FIGS. 1A to 1C, trenches 210 were formed on the substrate 200, a dielectric layer and a carbon layer 230 were formed, and subsequently a masking layer 240 was formed on the carbon layer 230 inside the trenches 210 filling the trenches 210 to a predetermined level. Here, the carbon layer 230 has a thickness of about 15 nm. After that, the substrate 200 was subjected to a plasma comprising hydrogen for a process time of two minutes. Moreover, further etch processes were successively conducted in order to remove the hereupon uncovered portion of the dielectric layer (not covered any more by the carbon layer), and in order to remove the hereupon uncovered portion of the substrate 200 (not covered any more by the dielectric layer). These additional etch processes were carried out in order to widen the trenches 210.

At the center section of the trenches 210, in the course of the hydrogen plasma etch process the portion of the carbon layer not being enclosed by the dielectric layer and the masking layer 240 was completely etched away. Accordingly, a widening of the trenches 210 occurs at the filling level of the masking layer 240, as can be seen from FIG. 2A. Here, the filling level of the masking layer 240 corresponds to a depth of about 1000 nm with respect to the substrate surface. In contrast thereto, with regard to the edge section of the trenches 210, the non-enclosed portion of the carbon layer 230 was only etched in an upper region of the trenches 210, as depicted in FIG. 2B. The "filling level" of the remaining carbon layer 230 corresponds to a depth of about 400 nm with respect to the substrate surface.

FIGS. 2C and 2D show cross sections of the substrate 200 in a center section (FIG. 2C) and an edge section (FIG. 2D) of the trenches 210 after applying similar process steps, however, the hydrogen plasma etch process was carried out with a process time of four minutes. At the center section of the trenches 210, again only the non-enclosed portion of the carbon layer was etched away due to the influence of the hydrogen plasma. Consequently, a widening of the trenches 210 occurs at the filling level of the masking layer 240, as can be seen from FIG. 2C, which corresponds to a depth of about 1000 nm with respect to the substrate surface. However, at the edge section of the trenches 210, the non-enclosed portion of the carbon layer 230 was also completely removed in the course of the hydrogen plasma etch process. Accordingly, now a widening of the trenches 210 occurs also at the filling level of the masking layer (depth about 1000 nm), as can be seen from FIG. 2D and the enlarged illustration of FIG. 2E.

The depicted cross sections of FIGS. 2A to 2E make clear the self-limiting or self-adjusting character of the hydrogen based plasma etch process applied to remove the carbon layer 230 to a predefined level. Although, in the center section of the trenches 210 a non-enclosed portion of the carbon layer was already completely removed after a process time of two minutes, a processing for an additional etch time of two minutes did not result in a removal of the enclosed portion of the carbon layer. Here, no voids or divots can be observed, i.e. the etch process stopped at the filling level of the masking layer 240. Moreover, the different etch results at the center and edge sections of the trenches 210 indicate a possible non-uniformity of the applied hydrogen plasma etch process.

Further methods making possible a well-directed structuring of a carbon material or carbon layer are explained in conjunction with the following Figures. Concerning process conditions and applied materials relating to a carbon deposition process and to a hydrogen based plasma etch process, reference is made to the above specifications indicated with respect to the method depicted in FIGS. 1A to 1C. However, the specifications are only considered exemplary and may be replaced by different process conditions and materials.

Figure 3A:
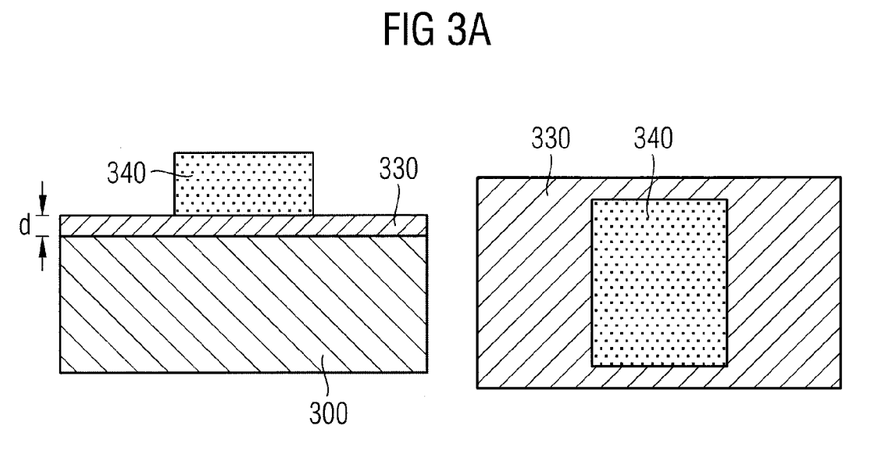
FIGS. 3A to 3C show schematic cross-sectional and plan views of a substrate illustrating steps of a method of fabricating a structured carbon layer.
Figure 3B:
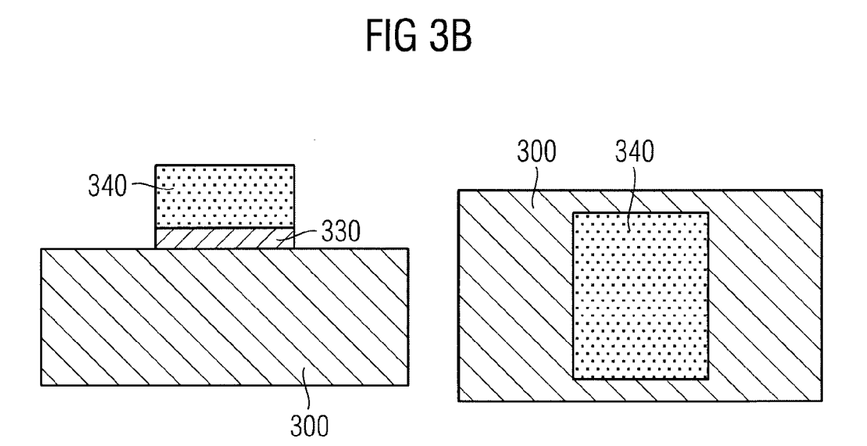
Figure 3C:
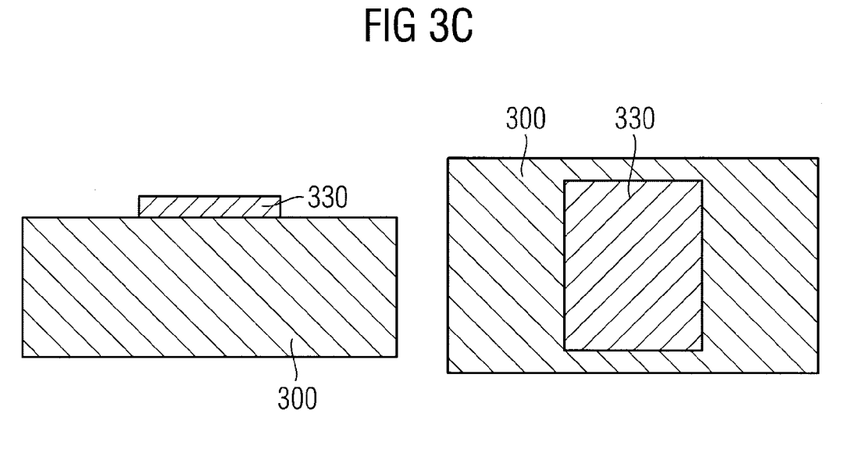

FIGS. 3A to 3C show schematic cross-sectional and plan views of a substrate 300 illustrating steps of a further method of fabricating a structured carbon layer. The substrate 300 may comprise a material which is relatively inert against a plasma comprising hydrogen. Alternatively, the substrate 300 may be covered by a layer or layer system comprising a material which is relatively inert against a hydrogen based plasma (not depicted).

As shown in FIG. 3A, a carbon material is deposited on a surface of the substrate 300 in order to form a carbon layer 330 with a defined thickness d. The thickness d of the carbon layer 330 may again be smaller than 50 nm. Subsequently, a masking layer 340 is formed on the carbon layer 330 which covers only a portion of the carbon layer 330. The masking layer 340 comprises a material which is relatively inert against a hydrogen based plasma and comprises e.g. poly silicon or silicon oxide. In addition, other relatively inert materials may be conceived.

Producing such a patterned masking layer 340 may be carried out by depositing the masking layer 340 in a large-area fashion on the carbon layer 330 and subsequently structuring the masking layer 340. Structuring the masking layer 340 may be carried out on the basis of a photolithographic process, i.e. a photoresist layer is applied to the masking layer 340 (not depicted), the photoresist layer is exposed and developed in a patterned fashion, thereby providing a patterned photoresist layer which serves as an etch mask in a subsequent etch process carried out to structure the masking layer 340.

After forming the patterned masking layer 340 covering only a portion of the carbon layer 330, the substrate 300 is processed with a plasma comprising hydrogen. In this way, an uncovered portion of the carbon layer 330 is etched away. Due to the defined thickness d of the carbon layer 330, which is also present at the intersection of the covered and the uncovered portion of the carbon layer 330, an etching of the covered portion of the carbon layer 330 is substantially suppressed in a self-limiting way, as illustrated in FIG. 3B. The substrate 300 may therefore be further on processed with the hydrogen plasma although the uncovered portion of the carbon layer 330 is completely removed, without a removal of the covered portion of the carbon layer 330.

In a subsequent optional process step, the masking layer 340 may be removed, e.g. by applying an appropriate wet or dry etch process or a polishing process like CMP (chemical mechanical polishing), so that only the structured carbon layer 330 remains on the surface of the substrate 300, as illustrated in FIG. 3C. The fabricated carbon layer 330 may e.g. serve as an electrode of a Schottky contact or Schottky barrier. Alternatively, the structured carbon layer 330 may be a another component like a contact pad or a terminal, e.g. a gate of a transistor.

Besides fabricating such integrated circuit components, the method may also be applied to fabricate carbon conductor paths on the surface of a substrate, e.g. word lines and bit lines. Structures of micromechanical devices having a carbon material may be formed as well. In addition, structuring a carbon layer according to the preceding method may be used to fabricate a carbon hard mask which is applied in an ion implantation process or in an etch process carried out to pattern a subjacent substrate or layer. Moreover, the method is not restricted to structure a carbon layer which is deposited on a substantially planar surface of a substrate. The method may also be applied to pattern a carbon layer which is formed on an uneven or structured substrate surface or layer.

Figure 4:
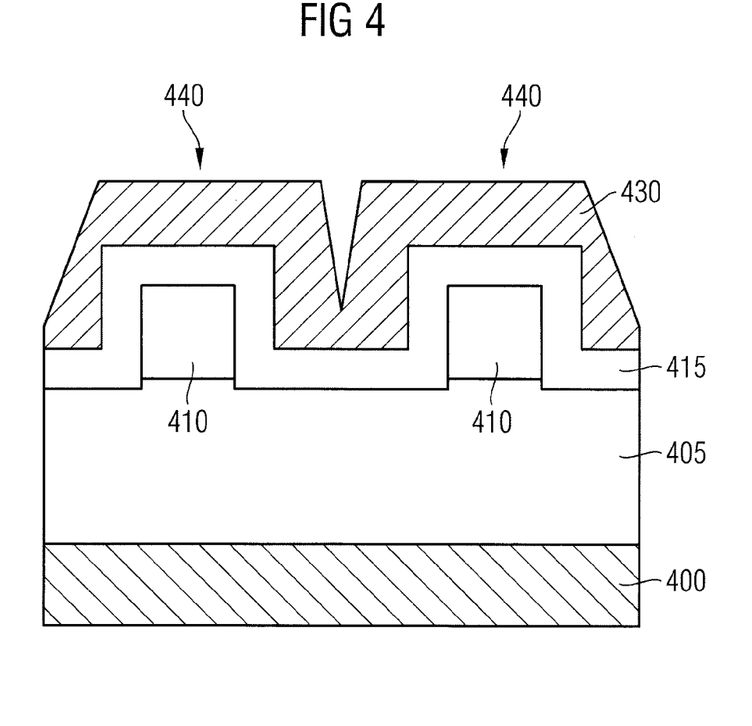
FIG. 4 shows a schematic cross section of a fin FET memory cell arrangement with a carbon word line.

For way of illustration, FIG. 4 shows a schematic cross section of an arrangement of two fin FET memory cells 440 with a carbon word line 430. As depicted in FIG. 4, an insulator layer 405 is disposed on the surface of a semiconductor substrate 400, and two fins 410 related to the individual memory cells 440 and a layer stack 415 having a stepped shape are arranged on the insulator layer 405. The fins 410 may e.g. comprise silicon. The layer stack 415 comprises a trapping layer, which may be used to trap electric charge carriers, thereby setting or changing a memory state of the memory cells 440.

In order to fabricate the word line 430, a carbon material is deposited in a large-area fashion on the structured surface constituted by the silicon fins 410 and the layer stack 415. In this way an uneven or stepped carbon layer is formed with a defined thickness, which may be below 50 nm. For patterning the deposited carbon layer and thus to form the carbon word line 430 only in a predetermined area, a masking layer is formed on top of the carbon layer which only covers the relevant portion of the carbon layer (not depicted). Subsequently, a hydrogen plasma etch process is carried out, whereby the uncovered portion of the carbon layer is removed. Due to the defined thickness of the carbon layer, however, the etch process is stopped at the covered portion of the carbon layer in a self-limiting way, i.e. the covered portion of the carbon layer is not removed and therefore forms the word line 430. After this, the masking layer may be removed.

The following Figures show further methods of structuring a carbon material. Again, the structured carbon material may constitute, as an example, a contact, an electrode or a terminal of a circuit component, or a structure of a micromechanical device. A structured carbon material fabricated by means of these methods may also serve as a vertical conductor or part of the latter, which is also referred to as a via.

Figure 5A:
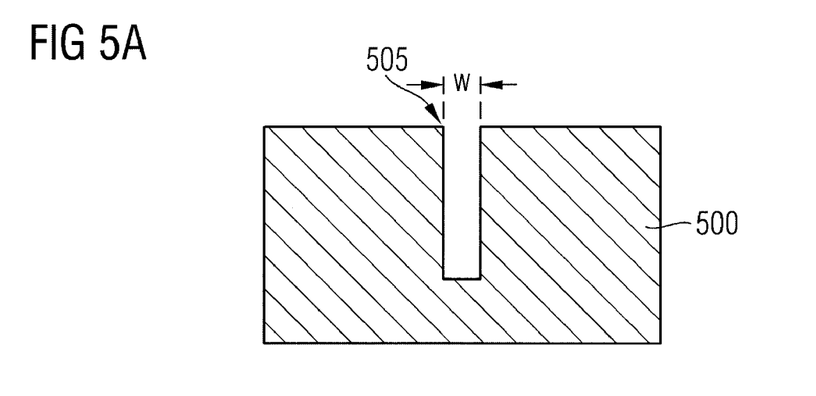
FIGS. 5A to 5C show schematic cross sections of a substrate illustrating steps of a method of fabricating a carbon material which fills a trench.
Figure 5B:
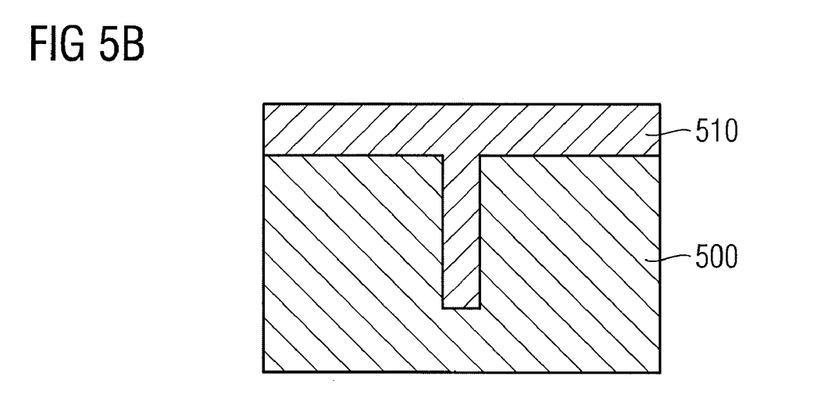
Figure 5C:
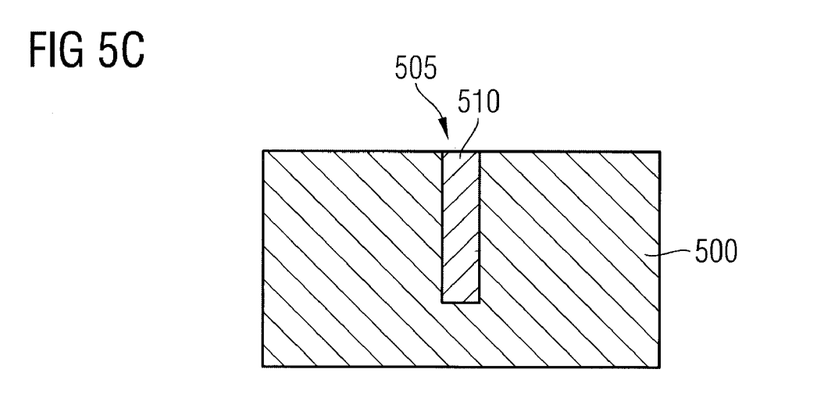

FIGS. 5A to 5C show schematic cross sections of a substrate 500 illustrating steps of a method of structuring a carbon material, which makes it possible to arrange the carbon material exclusively in a trench structure. As depicted in FIG. 5A, a substrate 500 is provided which comprises a trench 505 extending downwardly from a surface of the substrate 500. The trench 505 has a defined width w which may be below 50 nm. The substrate 500 may comprise a material, or be covered by a layer comprising a material which is relatively inert against a hydrogen based plasma (not depicted).

Subsequently, as illustrated in FIG. 5B, a carbon material 510 is deposited on the substrate 500 in a large-area fashion, thereby completely filling the trench 505 with the carbon material 510. Following the carbon deposition, the substrate 500 is processed with a plasma comprising hydrogen. Consequently, as depicted in FIG. 5C, only the non-enclosed portion of the carbon material located on the surface of the substrate 500 outside the trench 505 is removed. The defined width w of the trench 505, which is also present at the intersection of the enclosed and non-enclosed portion of the carbon material 510, results in a self-limiting etch stop substantially suppressing a removal of the enclosed portion of the carbon material 510 inside the trench 505.

Figure 6A:
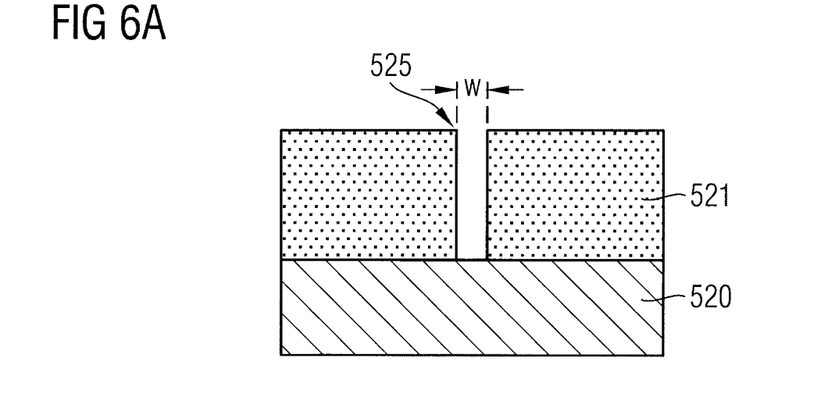
FIGS. 6A to 6C show schematic cross sections of a substrate illustrating steps of a method of fabricating a carbon material which fills a recess provided by a structured layer.
Figure 6B:
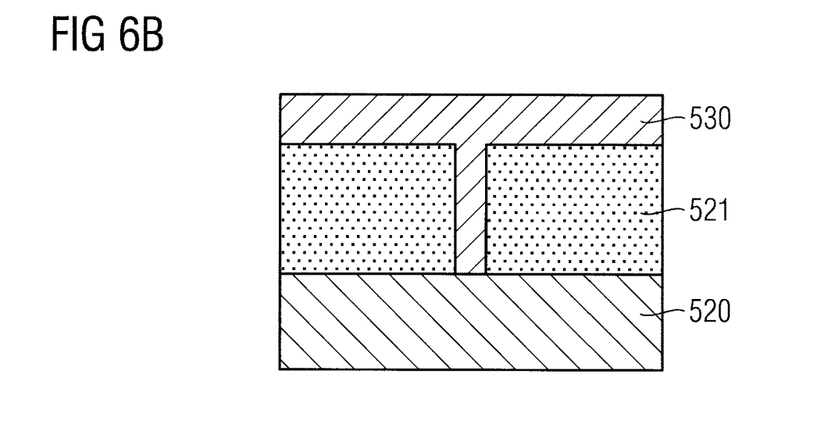
Figure 6C:
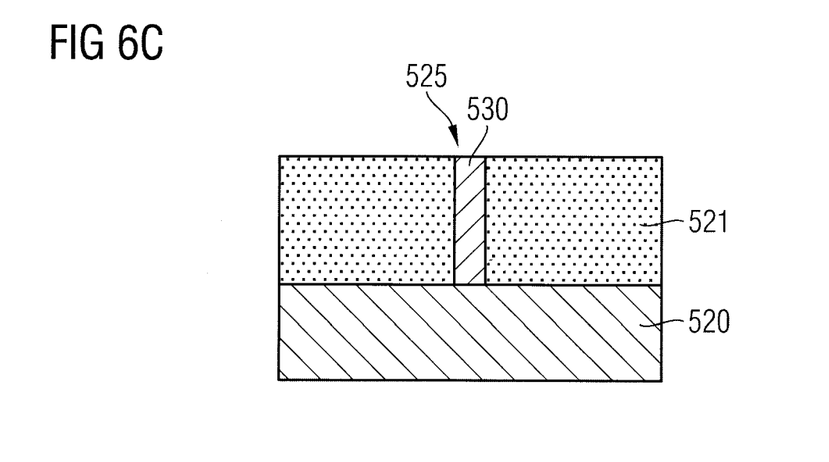

FIGS. 6A to 6C show schematic cross sections of a substrate 520 illustrating steps of a further method of fabricating a structured carbon material. As depicted in FIG. 6A, a structured layer 521 is formed on the surface of the substrate 520 having a material which is relatively inert against a hydrogen plasma. This step may comprise depositing a respective layer material on the substrate surface in a large-area fashion, and subsequently carrying out a photolithographic and an etch process, thereby forming the structured layer 521. The structured layer 521 provides a recess 525 with a defined width w which may be smaller than 50 nm.

After this, as illustrated in FIG. 6B, a carbon material is deposited on top of the substrate 520 and the structured layer 521, wherein the recess 525 is completely filled with the carbon material 530. Following the carbon deposition, the substrate 520 is subjected to a plasma comprising hydrogen. Accordingly, as depicted in FIG. 6C, only the non-enclosed portion of the carbon material located on the layer 521 outside the recess 525 is etched away. Again, the defined width w of the recess 525 substantially suppresses a plasma induced removal of the carbon material 530 located inside the recess 525 in a self-limiting way.

Figure 7A:
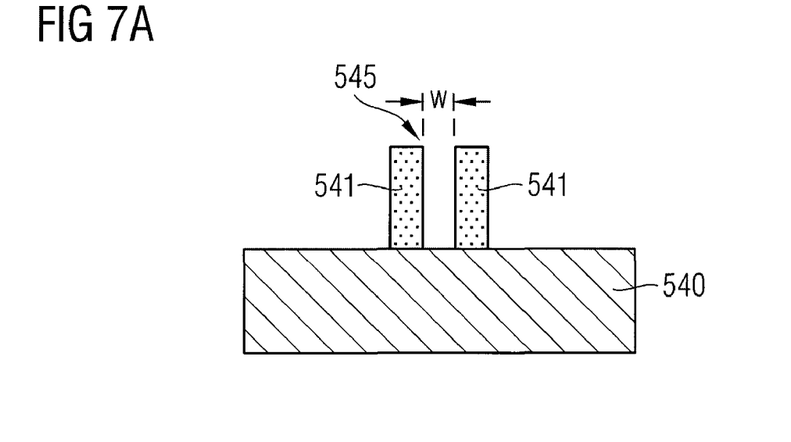
FIGS. 7A to 7C show schematic cross sections of a substrate illustrating steps of a method of fabricating a carbon material which fills a recess provided between spacers.
Figure 7B:
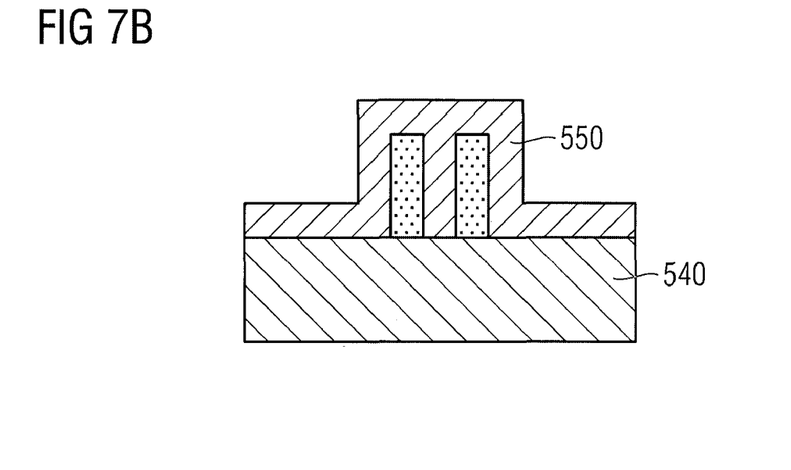
Figure 7C:
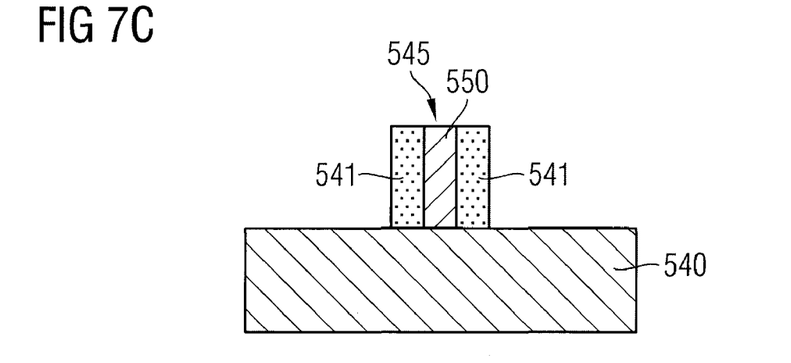

FIGS. 7A to 7C show schematic cross sections of a substrate 540 illustrating steps of a further method of fabricating a structured carbon material. The substrate 540 may comprise a material, or be covered by a layer comprising a material which is relatively inert against a hydrogen based plasma (not depicted). As illustrated in FIG. 7A, spacers 541 arranged in a distance from each other are formed on the surface of the substrate 540. Accordingly, a recess 545 is provided between the spacers 541 having a defined width w, which may be below 50 nm.

Subsequently, as illustrated in FIG. 7B, a carbon material 550 is deposited on the substrate 540 and the spacers 541 in a large-area fashion, thereby completely filling the recess 545 with the carbon material 550. After this, a plasma comprising hydrogen is applied to the substrate 540. In this way only the portion of the carbon material outside the recess 545 is removed, whereas the defined width w of the recess 545 substantially suppresses etching of the enclosed portion of the carbon material 550 inside the recess 545 in a self-limiting way (FIG. 7C). Following patterning of the carbon material 550, the spacers 541 may optionally be removed (not depicted).

Figure 8A:
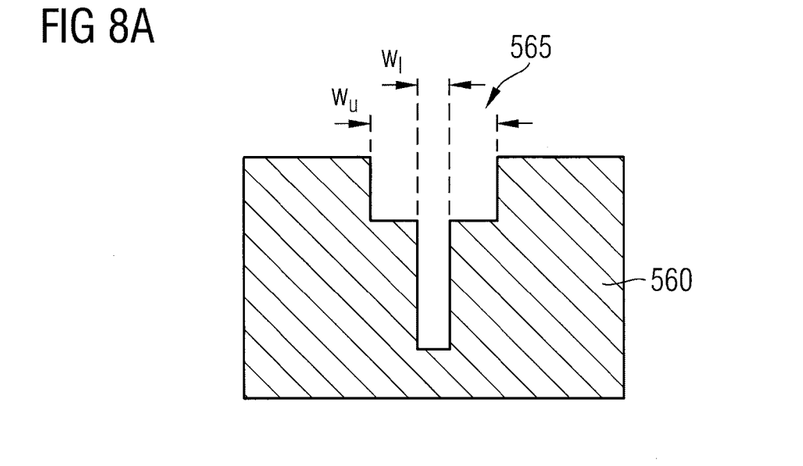
FIGS. 8A to 8C show schematic cross sections of a substrate illustrating steps of a method of fabricating a carbon material which fills a lower trench section of a trench structure.
Figure 8B:
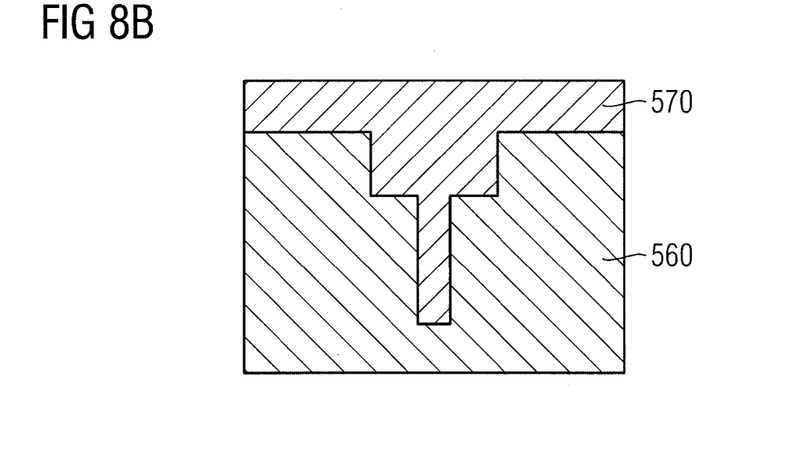
Figure 8C:
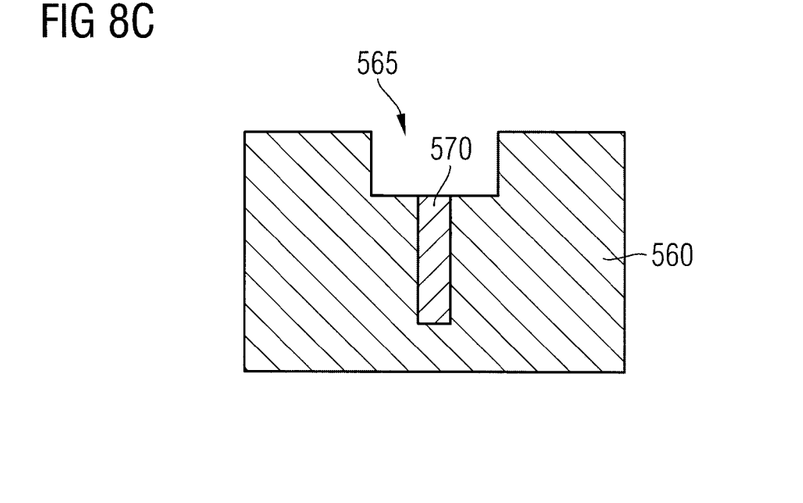

FIGS. 8A to 8C show schematic cross sections of a substrate 560 illustrating steps of another method of fabricating a structured carbon material. As depicted in FIG. 8A, a substrate 560 is provided which comprises a trench structure 565 arranged in a surface of the substrate 560. The substrate 560 may comprise a material, or be covered by a layer comprising a material which is relatively inert against a hydrogen plasma (not depicted).

The trench structure 565 comprises a wide upper trench section having a width $w_u$ and a lower trench section having a width $w_l$. The width $w_l$ of the lower trench section, which is substantially smaller than the width $w_u$ of the upper trench section, may be below 50 nm. As an example, the width $w_u$ of the upper trench section is 150 nm, and the width $w_u$ of the lower trench section is 25 nm. Moreover, the widths $w_u$ and $w_l$ of the upper and lower trench section of the trench structure 565 may have other values.

Subsequently, as illustrated in FIG. 8B, a carbon material 570 is deposited on the substrate 560 in a large-area fashion, thereby completely filling the trench structure 565 with the carbon material 570. Following the carbon deposition, the substrate 560 is processed with a hydrogen plasma. Consequently, as depicted in FIG. 8C, only the portion of the carbon material 570 located outside the lower trench section of the trench structure 565 is removed, because the width $w_l$ of the lower trench section, which is also present at the intersection of lower and upper trench section, substantially suppresses a removal of the portion of the carbon material 570 inside the lower trench section in a self-limiting way. Since the width $w_u$ of the upper trench section exceeds the width $w_l$ of the lower trench section, this etch stop characteristic does not apply to the upper trench section of the trench structure 565.

Figure 9A:
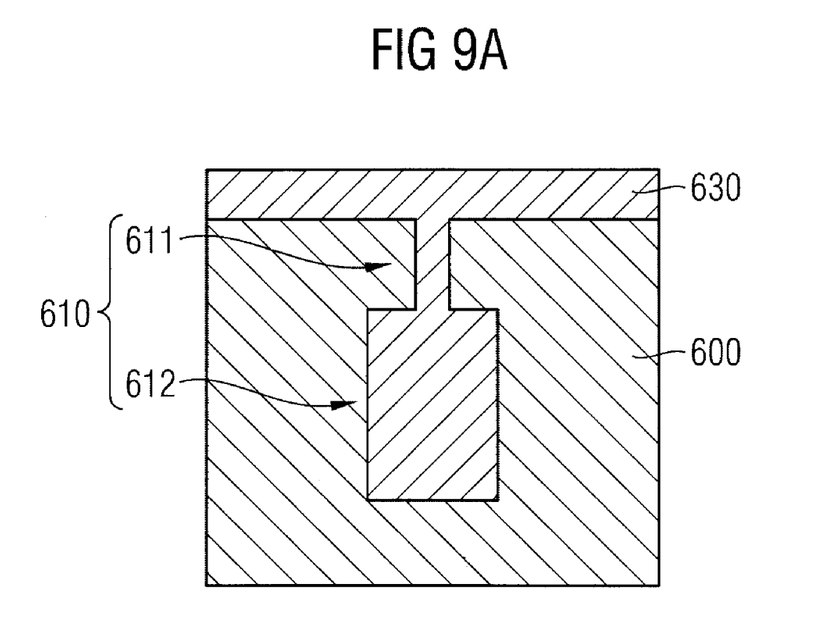
FIGS. 9A and 9B show schematic cross sections of a substrate illustrating steps of a further method of structuring a carbon material.
Figure 9B:
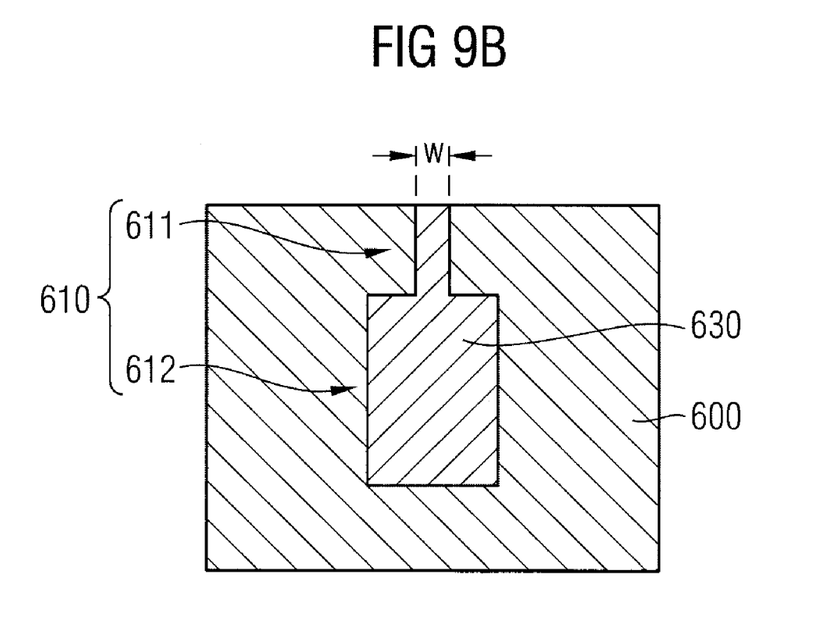

FIGS. 9A and 9B show schematic cross sections of a substrate 600 illustrating steps of yet another method of structuring a carbon material. As illustrated in FIG. 9A, a substrate 600 is provided having an enclosing structure 610 extending downwardly from a surface of the substrate 600, and a carbon material 630 deposited on a surface of the substrate 600 and filling the structure 610. The structure 610 comprises a lower section 612 and an upper section 611 having a defined width w which may be smaller than 50 nm. The defined width w is in particular present at the intersection of the portion of the carbon material 630 being enclosed by the structure 610 and the non-enclosed portion of the carbon material 630.

In order to only remove the non-enclosed portion of the carbon material 630 outside the structure 610, the substrate 600 is processed with a plasma comprising hydrogen. In this way, the non-enclosed portion of the carbon material 630 is etched away, wherein the defined width w at the intersection of the enclosed and non-enclosed portion of the carbon material 630 substantially suppresses a plasma induced removal of the enclosed portion of the carbon material 630 in a self-limiting way (FIG. 9B).

While the present invention has been described in terms of specific embodiments, it is evident in view of the foregoing description that various variations and modifications may be carried out in order to provide a method which makes it possible to selectively structure a carbon material or carbon layer in multiple ways.

As an example, with regard to the methods described with reference to FIGS. 5A to 8C, a recess or trench structure may be constituted or formed in different ways, e.g. by means of a complex layer system. Concerning the method described with reference to FIGS. 7A to 7C, alternative embodiments may be conceived in which spacers providing a recess with a defined width are e.g. formed on elevated structures or complex layer systems arranged on a substrate.

Moreover, the described methods show only examples of carbon structures having an enclosed portion and a further portion of a carbon material. Apart from the depicted structures, structures of a different shape and geometry may be conceived which have a defined cross-sectional dimension (e.g. provided by opposing sidewalls of a substrate, layer or spacers) at an intersection of the enclosed and the further portion of the carbon material, which width preventing or substantially suppressing a hydrogen plasma induced removal of the enclosed portion of the carbon material In addition, the term "substrate" is not intended to be interpreted in a limiting manner. A substrate applied in conjunction with the methods includes all possible carriers, e.g. a semiconductor wafer or a carrier for a micromechanical system. Further, the term "substrate" is not only limited to a bulk substrate or carrier, but also comprises carriers having e.g. a deposited layer, a layer stack or a complex layer system.

The preceding description describes exemplary embodiments of the invention. The features disclosed therein and the claims and the drawings can, therefore, be useful for realizing the invention in its various embodiments, both individually and in any combination. While the foregoing is directed to embodiments of the invention, other and further embodiments of this invention may be devised without departing from the basic scope of the invention, the scope of the present invention being determined by the claims that follow.

What is claimed is:

1. A method of making an integrated circuit, comprising:
    providing a substrate;
    forming a trench in the substrate;
    depositing a stepped carbon layer of carbon material on the substrate, the stepped carbon layer covering a bottom and sidewalls of the trench;
    depositing a masking layer cm the carbon layer inside the trench that fills the trench to a predetermined level, the masking layer covering a first enclosed portion of the carbon layer, and the masking layer not covering a second portion of the carbon layer; and
    processing the substrate with a plasma comprising hydrogen in order to etch the second portion of the carbon material, wherein a defined width between the masking layer and at least one sidewall of the trench substantially self-limits etching of the first enclosed portion of the carbon layer relative to the etching of the second portion of the carbon layer.

2. The method according to claim 1, wherein the thickness of the stepped carbon layer covering the sidewalls is less than 50 nm.

3. The method according to claim 1, wherein the plasma is formed from a gas mixture comprising hydrogen and an inert gas.

4. The method according to claim 1, where the plasma is formed from a forming gas comprising hydrogen and nitrogen.

5. The method according to claim 4, wherein a fraction of hydrogen in the forming gas is between 1 and 5.5%.

6. The method according to claim 4, wherein a fraction of hydrogen in the forming gas is 4%.

7. The method according to claim 1, wherein processing the substrate with the plasma is carried out at a pressure between 200 and 1200 mTorr, a temperature between 100 and 350° C. and with a plasma power between 500 and 3000 W, wherein a process gas used to form the plasma is applied with a gas flow rate between 100 and 10000 sccm.

8. The method according to claim 1, wherein processing the substrate with the plasma is carried out at a pressure of 650 mTorr, a temperature of 250° C. and with a plasma power of 2500 W, wherein a process gas used to form the plasma is applied with a gas flow rate of 4000 sccm.

9. The method according to claim 1, wherein forming the stepped carbon layer comprises pyrolytically depositing the carbon material on the substrate.

10. The method according to claim 1, wherein forming the stepped carbon layer comprises depositing the carbon material on the substrate from a process gas which is one of ethane, ethylene or methane.

11. The method according to claim 1, wherein forming the stepped carbon layer comprises depositing the carbon material on the substrate at a pressure between 10 and 1013 hPa and a temperature between 400 and 1200° C., wherein a process gas used to deposit the carbon material is applied with a gas flow rate between 1 sccm and 10 slm.

12. The method according to claim 1, wherein forming the stepped carbon layer comprises depositing the carbon material on the substrate at a pressure between 300 and 700 hPa and a temperature between 600 and 950° C., wherein a process gas used to deposit the carbon material is applied with a gas flow rate between 1 and 5 slm.

13. A method of making an integrated circuit, comprising:
providing a substrate, the substrate including a trench;
forming a carbon layer on the substrate having a defined thickness, the carbon layer covering a bottom and sidewalls of the trench;
forming a masking layer on the carbon layer, the masking layer filling the trench;
recessing the masking layer to fill the trench only to a predetermined level; and
processing the substrate with plasma comprising hydrogen to etch the carbon layer to the predetermined level of the masking layer, wherein a defined width between the masking layer and at least one sidewall of the trench substantially self-limits etching of the carbon layer between the masking layer and the at least one sidewall of the trench relative to the etching of the carbon layer not between the masking layer and the sidewalls of the trench.

14. The method according to claim 13, wherein the defined thickness of the carbon layer covering the sidewalls is less than 50 nm.

15. The method according to claim 13, wherein the masking layer comprises a material which is relatively inert against a plasma comprising hydrogen.

16. The method according to claim 13, wherein the masking layer comprises one of a poly silicon or a silicon oxide.

17. The method according to claim 13, wherein the substrate comprises a structured surface, and wherein the carbon layer is formed on the structured surface.

18. A method of making an integrated circuit comprising the steps of:
providing a substrate having a recess with a defined width, the defined width being less than 50 nm;
depositing a carbon material on the substrate, wherein the recess is completely filled with the carbon material; and
processing the substrate with a plasma comprising hydrogen to etch a portion of the carbon material outside the recess, wherein the defined width of the recess substantially self-limits etching of the carbon material inside the recess relative to the etching of the carbon material outside the recess.

19. The method according to claim 18, wherein the recess is a trench formed on the substrate.

20. The method according to claim 18, wherein the substrate comprises a structured layer providing the recess.

21. The method according to claim 18, wherein the substrate comprises spacers, wherein the recess is provided between the spacers.

22. The method according to claim 18, wherein the substrate comprises a trench structure having an upper trench section and a lower trench section, wherein a width of the upper trench section exceeds a width of the lower trench section, wherein the trench structure is completely filled with the carbon material, and wherein, when processing the substrate with the plasma, the width of the lower trench section substantially self-limits etching of the carbon material inside the lower trench section of the trench structure.

* * * * *